(12) United States Patent
Callas et al.

(10) Patent No.: US 7,254,953 B2
(45) Date of Patent: Aug. 14, 2007

(54) THERMOELECTRIC HEAT EXCHANGE ELEMENT

(75) Inventors: James J. Callas, Peoria, IL (US); Mahmoud A. Taher, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 186 days.

(21) Appl. No.: 11/029,471

(22) Filed: Jan. 6, 2005

(65) Prior Publication Data

US 2006/0144052 A1    Jul. 6, 2006

(51) Int. Cl.
    *F25B 21/02*    (2006.01)
(52) U.S. Cl. .......................... 62/3.7; 62/3.61
(58) Field of Classification Search ............... 62/3.7, 62/3.2, 3.3, 3.6, 3.61
    See application file for complete search history.

(56) References Cited

U.S. PATENT DOCUMENTS

| | | | |
|---|---|---|---|
| 3,937,028 A | 2/1976 | Alais | |
| 4,346,750 A | 8/1982 | Vidal-Meza | |
| 6,444,896 B1 | 9/2002 | Harman et al. | |
| 6,539,725 B2 | 4/2003 | Bell | |
| 6,557,354 B1 | 5/2003 | Chu et al. | |
| 6,598,405 B2 | 7/2003 | Bell | |
| 6,605,772 B2 | 8/2003 | Harman et al. | |
| 6,625,990 B2 | 9/2003 | Bell | |
| 6,637,210 B2 | 10/2003 | Bell | |
| 6,696,635 B2* | 2/2004 | Prasher ........................ 136/201 |
| 6,893,189 B2 | 5/2005 | Matsushita et al. | |
| 6,894,215 B2 | 5/2005 | Akiba | |
| 2004/0045594 A1 | 3/2004 | Hightower | |
| 2004/0055312 A1* | 3/2004 | Bell ............................ 62/3.7 |
| 2005/0139250 A1 | 6/2005 | DeSteese et al. | |

FOREIGN PATENT DOCUMENTS

| | | |
|---|---|---|
| DE | 197 15 989 | 7/1998 |
| EP | 0731513 | 9/1996 |
| EP | 0952017 | 10/1999 |
| JP | 2-198179 | 8/1990 |
| JP | 2-303381 | 12/1990 |

* cited by examiner

*Primary Examiner*—Melvin Jones
(74) *Attorney, Agent, or Firm*—Finnegan, Henderson, Farabow, Garrett & Dunner (57) ABSTRACT

A thermoelectric heat exchange module includes a first substrate including a heat receptive side and a heat donative side and a series of undulatory pleats. The module may also include a thermoelectric material layer having a ZT value of 1.0 or more disposed on at least one of the heat receptive side and the heat donative side, and an electrical contact may be in electrical communication with the thermoelectric material layer.

22 Claims, 7 Drawing Sheets

THERMOELECTRIC HEAT EXCHANGE ELEMENT

U.S. GOVERNMENT RIGHTS

This invention was made with government support under the terms of Subcontract No. ZCL-4-32060-04, under Contract No. DE-AC36-99GO10337, awarded by the Department of Energy. The government may have certain rights in this invention.

TECHNICAL FIELD

This disclosure relates generally to thermoelectric heat exchange systems, and more particularly to a thermoelectric heat exchange element.

BACKGROUND

A thermoelectric material is a type of material that can directly convert thermal energy into electrical energy or vice versa. Thermoelectric materials can produce a voltage potential in the presence of a temperature gradient across the thermoelectric materials and, alternately, can produce a temperature gradient in response to an applied voltage potential. The magnitudes of the temperature gradient and the voltage may be proportionally related.

Based on these properties, attempts have been made to create thermoelectric-enhanced heat exchangers to include thermoelectric materials in heat exchanger arrangements. For example, U.S. Pat. No. 6,557,354 ("the '354 patent") issued to Chu et al. on May 6, 2003, describes a thermoelectric-enhanced heat exchanger for facilitating heat removal within a cooling system for an electronic device. However, the heat exchanger described in the '354 patent, like other conventional thermoelectric-enhanced heat exchangers, may suffer from low efficiencies due to the use of bulk thermoelectric materials. Further, the efficiency of the heat exchanger of the '354 patent may be limited by a low surface area to volume configuration of the heat exchange elements.

Methods and systems consistent with certain features of the disclosed specification are directed to solving one or more of the problems set forth above.

SUMMARY OF THE INVENTION

One aspect of the present disclosure includes a thermoelectric heat exchange module having a first substrate including a heat receptive side and a heat donative side and a series of undulatory pleats. The module may also include a thermoelectric material layer having a ZT value of 1.0 or more disposed on at least one of the heat receptive side and the heat donative side, and an electrical contact may be in electrical communication with the thermoelectric material layer.

Another aspect of the present disclosure includes a work machine. The work machine may include an engine that produces an exhaust stream. An exhaust system may be configured to carry the exhaust stream, and a thermoelectric heat exchange module may be placed in the exhaust system. The thermoelectric heat exchange module may include a first substrate including a heat receptive side and a heat donative side and a series of undulatory pleats. A thermoelectric material layer having a ZT value of 1.0 or more may be disposed on at least one of the heat receptive side and the heat donative side, and an electrical contact may be in electrical communication with the thermoelectric material layer.

Another aspect of the present disclosure includes a method for recovering energy from a work machine exhaust system. The method may include flowing an exhaust stream from an engine through a thermoelectric heat exchange module that includes a first substrate including a heat receptive side and a heat donative side and a series of undulatory pleats, a thermoelectric material layer having a ZT value of 1.0 or more disposed on at least one of the heat receptive side and the heat donative side, and an electrical contact in electrical communication with the thermoelectric material layer. The method may further include using the flowing exhaust stream to heat a first side of the thermoelectric material and cooling a second side of the thermoelectric material to generate a temperature gradient across the thermoelectric material and a related voltage level. The voltage level may be provided on the electrical contact for use by at least one electrically powered component.

BRIEF DESCRIPTION OF THE DRAWINGS

The accompanying drawings, which are incorporated in and constitute a part of this specification, illustrate several embodiments and together with the description, serve to explain the principles of the disclosed embodiments. In the drawings.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
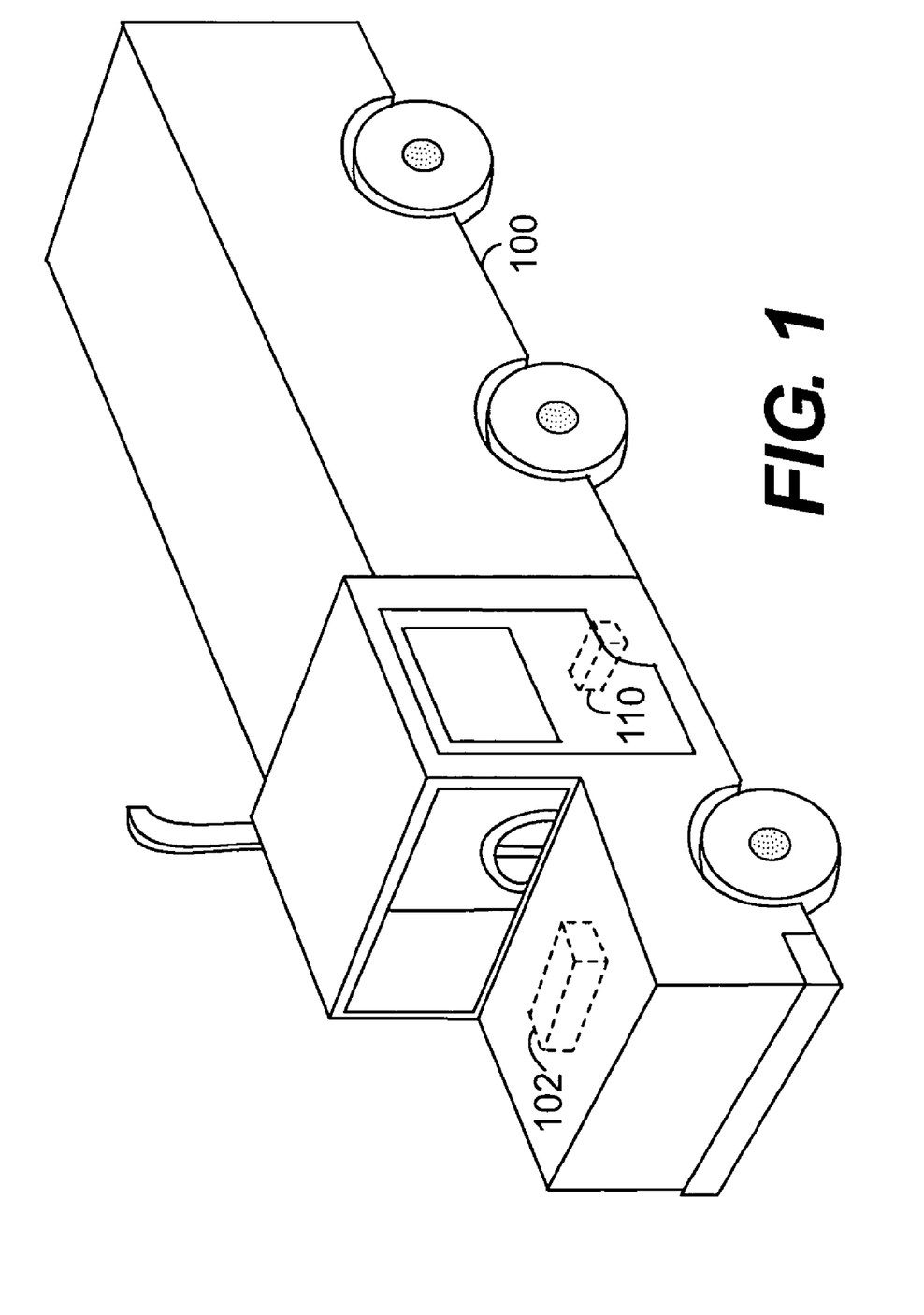
FIG. 1 is a pictorial illustration of a work machine incorporating an exemplary high efficiency thermoelectric heat exchange system.

FIG. 1 illustrates an exemplary high efficiency thermoelectric heat exchange system 110 incorporated into a work machine 100. Work machine 100 may refer to any type of fixed or mobile machine that performs some type of operation associated with a particular industry, such as mining, construction, farming, transportation, etc. and operates between or within work environments (e.g., construction site, mine site, power plants, on-highway applications, etc.). Work machine 100 may also refer to any type of automobile or commercial vehicle. Non-limiting examples of mobile machines include on-highway vehicles, commercial machines, such as trucks, cranes, earth moving vehicles, mining vehicles, backhoes, material handling equipment, farming equipment, marine vessels, aircraft, and any type of movable machine that operates in a work environment, and/or cars, vans, trucks, and any type of automobiles and commercial vehicles. Although, as shown in FIG. 1, work machine 100 is an on-highway truck, it is contemplated that work machine 100 may be any type of work machine. Further, work machine 100 may be a conventionally powered, hybrid electric powered, and/or fuel cell powered work machine.

As shown in FIG. 1, work machine 100 may include an engine 102 to provide power to work machine 100 and a variety of components (not shown) on work machine 100. Engine 102 may be any type of engine, such as an internal combustion engine. Engine 102 may generate significant levels of waste heat when providing power to work machine 100. This waste heat may be expelled to the atmosphere through an exhaust system. In certain disclosed embodiments, work machine 100 may incorporate a thermoelectric heat exchange system 110 to recover at least a portion of the thermal energy associated with the waste heat expelled by the exhaust system.

Thermoelectric heat exchange system 110 may be configured to convert waste heat generated by engine 102 to electrical energy. Thermoelectric heat exchange system 110 may also be configured to perform different applications under certain situations. For example, thermoelectric heat exchange system 110 may be configured to convert energy from any source of heat on work machine 100, or any other type of device or application, into electrical energy. Further, thermoelectric heat exchange system 110 may be configured to provide heating and/or cooling in a variety of applications (e.g., heating and/or cooling air or other components of work machine 100). Such heating and/or cooling may be accomplished by heating and/or cooling a heat transfer fluid using an applied voltage supplied to thermoelectric materials of thermoelectric heat exchange system 110. The functional structures of thermoelectric heat exchange system 110 are illustrated in FIG. 2.

Figure 2:
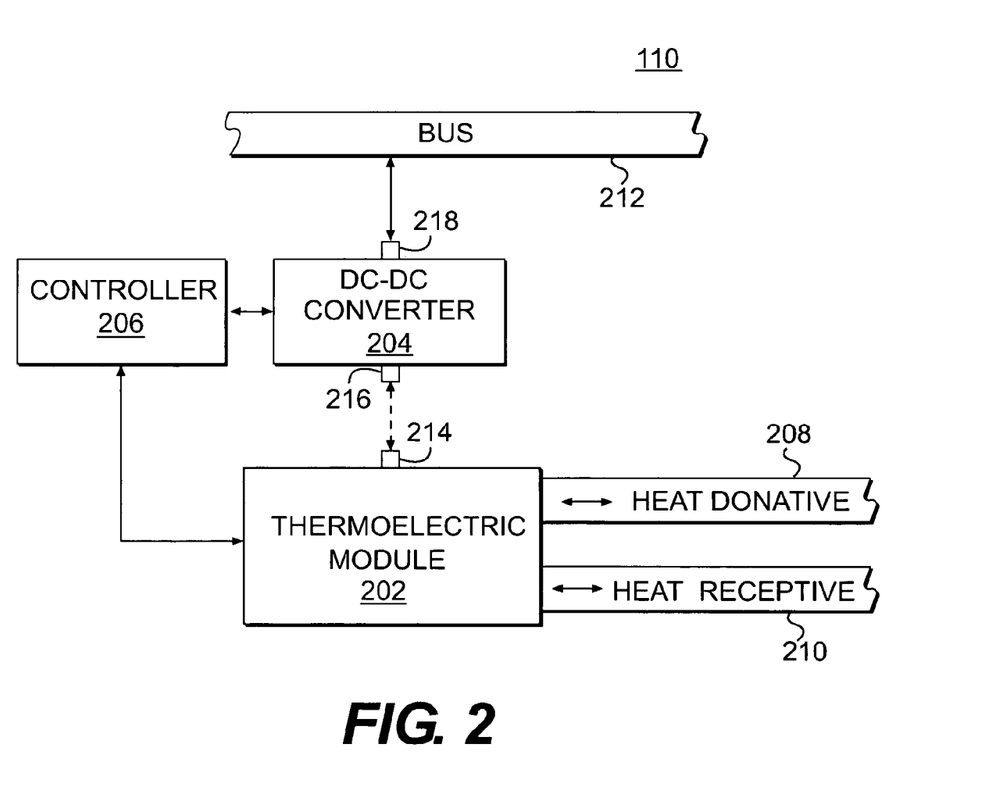
FIG. 2 provides a block diagram of an exemplary high efficiency thermoelectric heat exchange system consistent with certain disclosed embodiments.
Figure 3A:
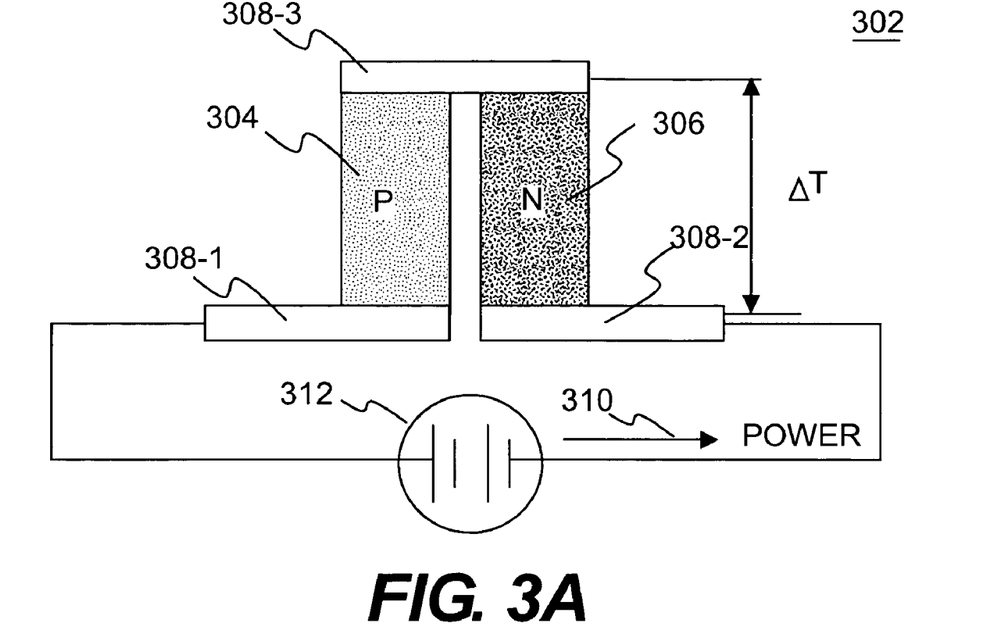
FIGS. 3A-3F illustrate exemplary configurations of thermoelectric materials consistent with certain disclosed embodiments.

As shown in FIG. 2, thermoelectric heat exchange system 110 may include a thermoelectric module 202, a DC-DC converter 204, a controller 206, a heat donative fluid flow 208, a heat receptive fluid flow 210, and an electric bus 212. Through use of thermoelectric materials, thermoelectric module 202 may recover at least a portion of the energy associated with the waste heat produced by engine 102. Thermoelectric materials may be operated based on the Seebeck effect or the Peltier effect. FIG. 3A illustrates an exemplary configuration of thermoelectric materials operating based on the Peltier effect.

As shown in FIG. 3A, thermoelectric materials may be semiconductors that are packaged in a thermoelectric couple 302. Thermoelectric couple 302 may include a positive-type P element 304 and a negative-type N element 306. Thermoelectric couple 302 may also include junctions 308-1 to 308-3. When electrical power 310 from a current source 312 is passed through thermoelectric couple 302, a temperature gradient ΔT across junctions 308-1 and 308-2 and junctions 308-3 of thermoelectric couple 302 may be generated. Such phenomenon is known as the Peltier effect. The polarity of the temperature gradient (i.e., which junction or junctions have a high temperature) may be determined by the polarity of current source 312 providing power 310 to thermoelectric couple 302.

Figure 3B:
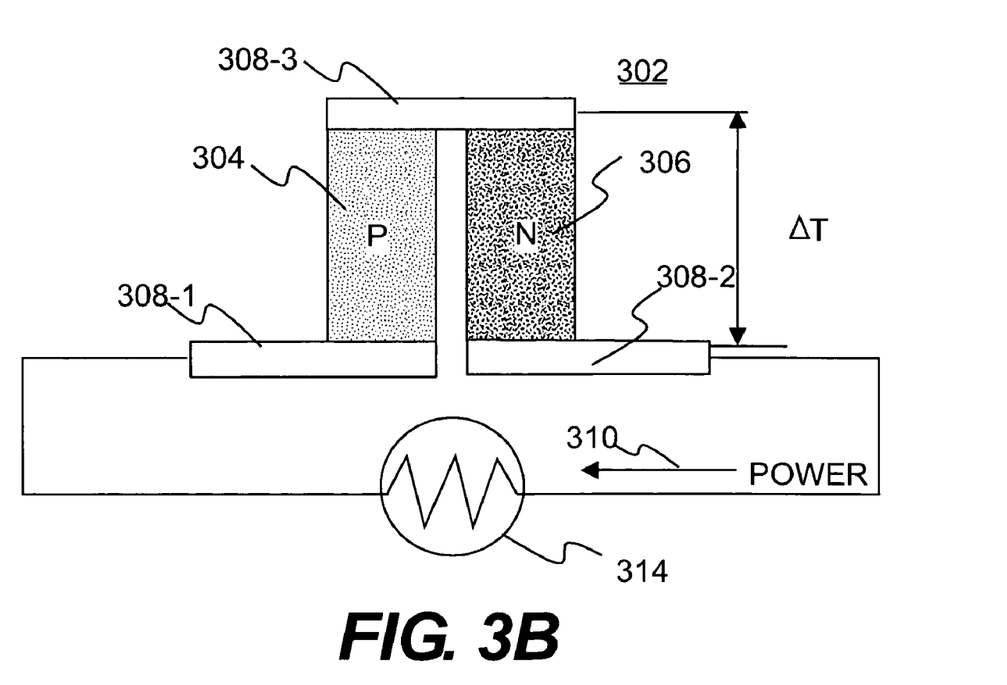

Conversely, as shown in FIG. 3B, electrical power 310 may be generated through an electrical load 314 if a temperature difference ΔT is maintained between the junctions 308-1 and 308-2 and junction 308-3 of thermoelectric couple 302 (a phenomenon known as the Seebeck effect). This temperature difference can be maintained by providing a heat source at one junction and a heat sink at the other junctions.

The effectiveness of a thermoelectric material in converting electrical energy to heating or cooling energy (i.e., coefficient of performance "COP"), or converting heat energy to electrical energy (conversion efficiency "η") depends on the thermoelectric material's figure of merit termed "Z" and the average operating temperature "T". Z is a material characteristic that is defined as:

$$Z = \frac{S^2 \sigma}{\lambda},$$

where S is the Seebeck coefficient of the material, σ is the electrical conductivity of the material, and λ is the thermal conductivity of the material.

Because Z changes as a function of temperature, Z may be reported along with the temperature T, at which the properties are measured. Thus, the dimensionless product ZT may be used instead of Z to reflect the effectiveness of the thermoelectric material. To improve the COP or η of thermoelectric materials, an increase in ZT may be necessary.

From the definition of Z, an independent increase in the Seebeck coefficient and/or electrical conductivity, or an independent decrease in the thermal conductivity may contribute to a higher ZT. Conventional low ZT thermoelectric materials, also known as bulk thermoelectric materials, may have ZT values that do not exceed one (1). Newly developed thermoelectric materials with low dimensional structures have demonstrated a higher figure of merit ZT that may approach 5 or more. These materials include zero-dimensional quantum dots, one-dimensional nano wires, two-dimensional quantum well and superlattice thermoelectric structures.

While bulk thermoelectric materials may be used in thermoelectric generator 210, in certain embodiments, high ZT thermoelectric materials may also be used. High efficiency thermoelectric materials that may have ZT values between 1.0 and 10 may be provided consistent with the disclosed embodiments. The described ZT values are exemplary only and not intended to be limiting. High efficiency thermoelectric materials with other ZT values may also be used.

Figure 3C:
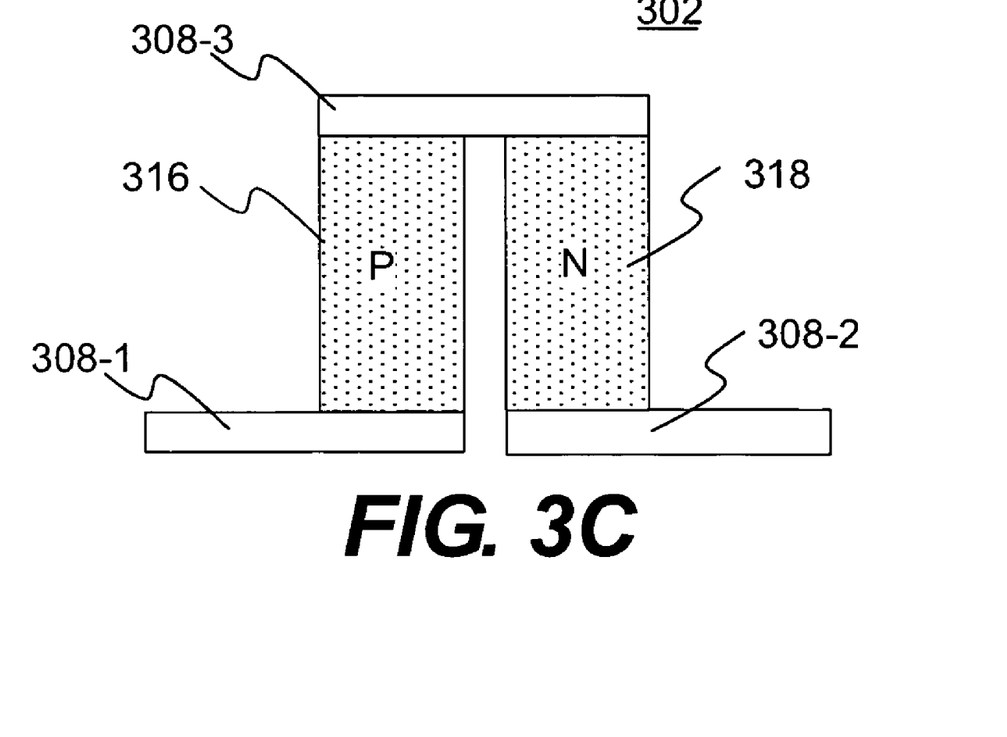
Figure 3D:
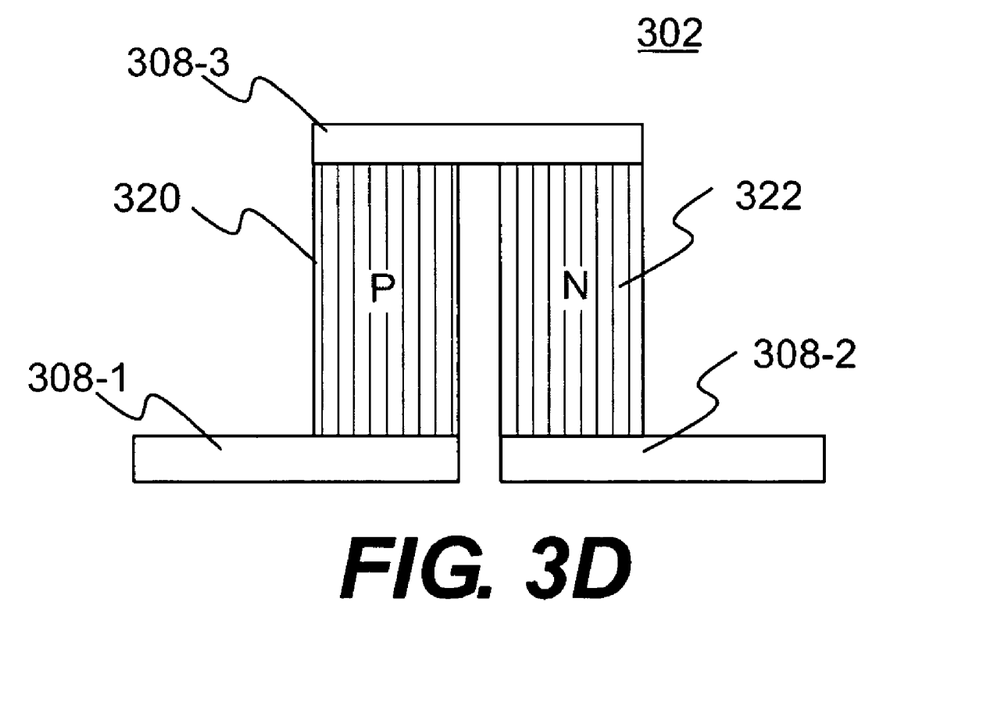

In one embodiment, as shown in FIG. 3C, thermoelectric couple 302 may include a P element 316 and an N element 318 that may be made of zero-dimensional quantum dots of lead-tin-selenium-telluride or other thermoelectric materials. In another embodiment, as shown in FIG. 3D, thermoelectric couple 302 may include a P element 320 and an N element 322 that may be made of one-dimensional nano wires of bismuth-antimony or other thermoelectric materials. In another embodiment, as shown in FIG. 3E, thermoelectric couple 302 may include a P element 324 and an N element 326 that may be made of two-dimensional quantum well or superlattice thermoelectric structures of silicon-germanium, boron-carbon or other thermoelectric materials.

Figure 3E:
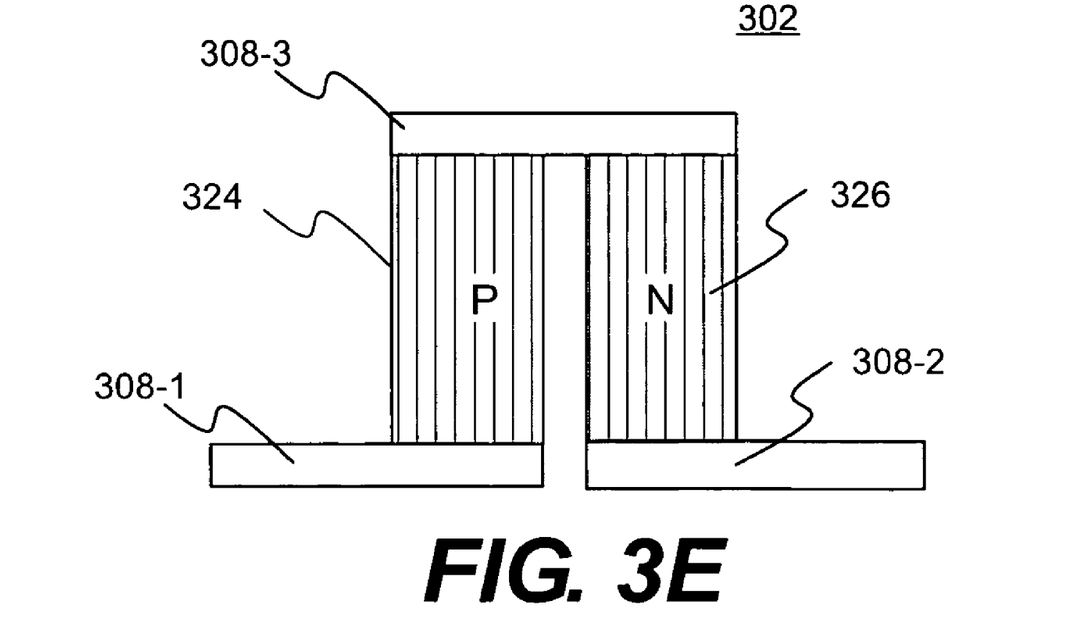
Figure 3F:
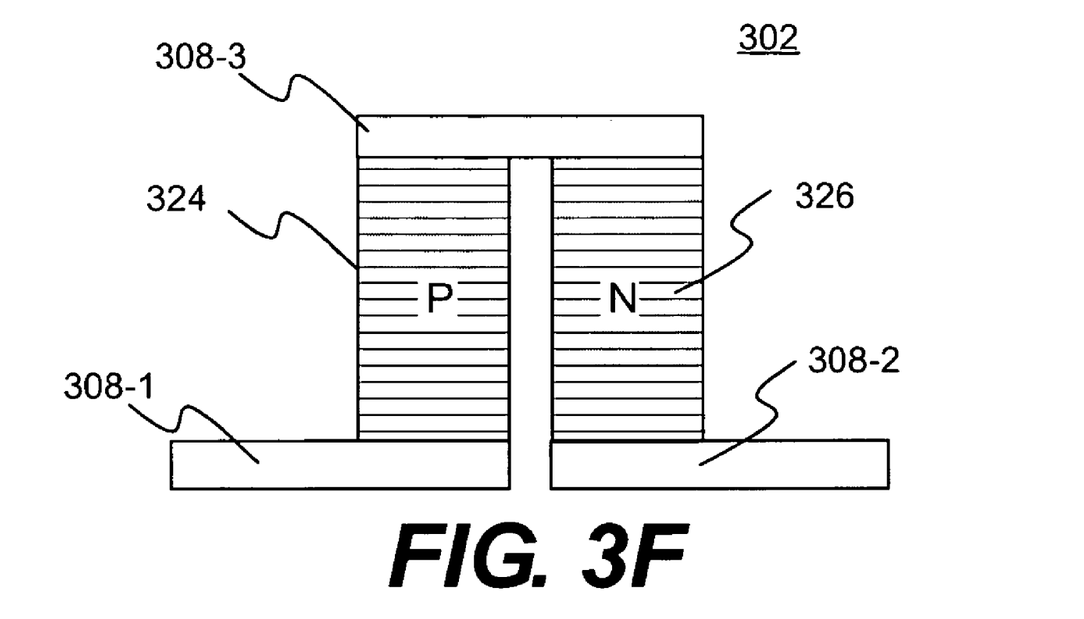

As explained above, thermoelectric couple 302 may include thermoelectric materials having low dimensional structures, such as two-dimensional quantum wells, for example, illustrated as a series of parallel lines in FIGS. 3E-3F. Arrangement of the low dimensional structures relative to the flow of heat may be in-plane (i.e., the dimension is in a same direction of the flow of heat between junctions), as shown in FIG. 3E. Alternatively, the arrangement of the low dimensional structures relative to the flow of heat may also be cross-plane (i.e., the dimension is in a cross direction of the flow of heat between junctions), as shown in FIG. 3F.

It is understood that the disclosed structures of thermoelectric couple 302, the thermoelectric materials used, and the ZT values of the thermoelectric materials used are exemplary and not intended to be limiting. Other structures and thermoelectric materials may be included without departing from the principle and scope of disclosed embodiments. For example, in certain embodiments, thermoelectric couple 302 used by thermoelectric module 202 may include P elements with different structures from N elements. For instance, the P elements may be made of zero-dimensional quantum dots, while the N elements may be made of two-dimensional quantum well or superlattice thermoelectric structures.

Returning to FIG. 2, heat donative fluid flow 208 and heat receptive fluid flow 210 may be provided to generate and/or maintain a temperature gradient across the thermoelectric materials with thermoelectric heat exchange system 110. Heat donative fluid flow 208 and heat receptive fluid flow 210 may be formed differently depending on particular applications of thermoelectric heat exchange system 110. For example, if thermoelectric heat exchange system 110 is used to convert waste heat of work machine 100 to electrical energy, heat donative fluid flow 208 may be formed by accepting an exhaust stream generated by an engine of work machine 100 (not shown). Heat receptive fluid flow 210 may be formed by coupling a cooling line of work machine 100 with thermoelectric module 202 to cool the thermoelectric materials within thermoelectric module 202.

In one embodiment, thermoelectric module 202 may be coupled with heat donative fluid flow 208 to receive a source of heat (e.g., an exhaust stream from engine 102) on one side of thermoelectric materials included in thermoelectric module 202. Another side of the thermoelectric materials may be cooled by heat receptive flow 210 (e.g., coolant in a cooling line). It should be noted that the disclosed methods and systems may use any type of heat exchange fluid including, for example, air, other types of gases, liquids, or a combination of gas and liquid. Through application of heat donative fluid flow 208 and heat receptive fluid flow 210 to different sides of the thermoelectric materials of thermoelectric module 202, a temperature gradient can be generated and maintained across the thermoelectric materials. As a result, a voltage may be generated on an output/input voltage terminal 214 of thermoelectric module 202. Output/input voltage terminal 214 of thermoelectric module 202 may be further coupled with an input/output voltage terminal 216 of DC-DC converter 204. The generated voltage may then be converted to an output voltage on an output/input voltage terminal 218 at a desired level (e.g., 14.4V, 30V, 300V, etc.) by DC-DC converter 204. The output voltage on output/input voltage terminal 218 of DC-DC converter 212 may then be sent to electric bus 212 to be used by other systems (not shown) of work machine 100.

DC-DC converter 204 may be any type of electronic device that accepts a DC input voltage and produces a DC output voltage at a same or different level than the input voltage. DC-DC converter 204 may also regulate the input voltage or isolate noises on the input. Further, DC-DC converter 204 may operate automatically based on a default setting or operate under the control of controller 206 to perform more complex operations. Electric bus 212 may be a low voltage bus or a high voltage bus to provide electricity for other systems (not shown) within work machine 100. Electric bus 212 may operate at any desired voltage level.

Controller 206 may control both thermoelectric module 202 and DC-DC converter 204 to coordinate the operations of thermoelectric heat exchange system 110. Because the voltage generated by thermoelectric module 202 may be dependent on the temperature gradient across the thermoelectric material included in thermoelectric module 202, and the temperature gradient can vary significantly, the generated voltage may also vary significantly. Controller 206 may control DC-DC converter 204 to account for voltage changes on the voltage output of thermoelectric module 202 and to maintain the output voltage to electric bus 212 at a substantially constant level.

Figure 4:
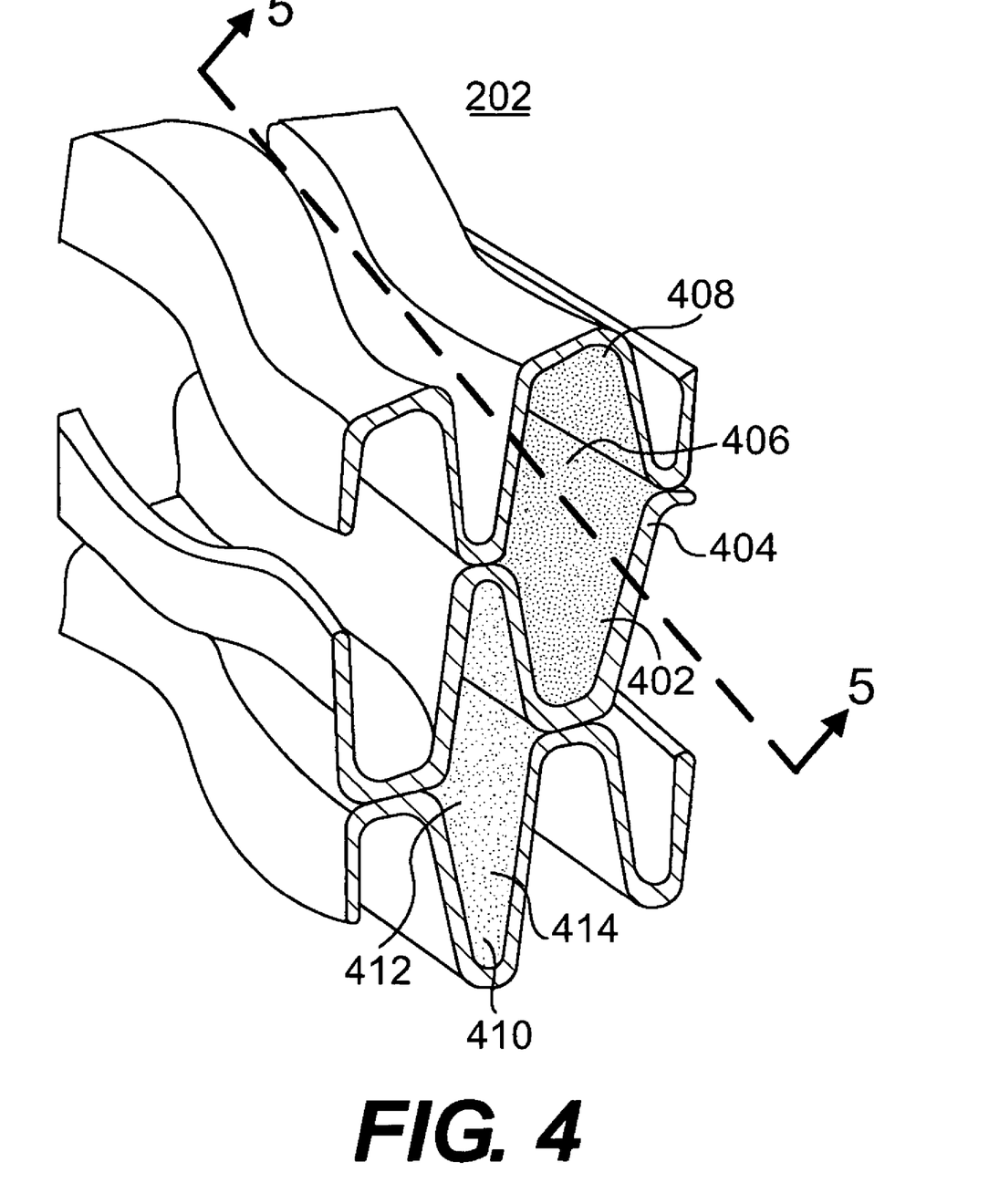
FIG. 4 is a pictorial illustration of an exemplary thermoelectric module consistent with certain disclosed embodiments.

Thermoelectric module 202 may be configured to provide high heat exchanging efficiency. For example, thermoelectric module 202 may include a structure with a high surface area-to-volume ratio and/or high heat transfer surface area density. As shown in FIG. 4, thermoelectric module 202 may include a plurality of thermoelectric heat exchange elements 402 and 410. Thermoelectric heat exchange element 402 may include a substrate 404 and a thermoelectric material layer 408 on substrate 404. Similarly, thermoelectric heat exchange element 410 may also include substrate 404 and a thermoelectric material layer 414 on substrate 404. A fluid flow passage 406 and a fluid flow passage 412 may be created by opposing structures (e.g., undulatory pleats) of heat exchange element 402 and heat exchange element 410. The surface-to-volume ratio and/or heat transfer surface area density of thermoelectric module 202 may be increased by increasing the number of fluid flow passages 406, 412 included in thermoelectric module 202.

As noted, fluid flow passages 406 and 412 may include geometrically shaped passageways formed by opposing structures of heat exchange element 402 and heat exchange element 410. For example, a plurality of substrates 404, including the substrates of elements 402 and 410, among others, may include these opposing structures. For example, a plurality of fluid flow passages 406, 412 may be formed by pressing two substrates 404 together such that the undulatory pleats (or another appropriate type of structure) of one substrate oppose the undulatory pleats (or other appropriate type of structure) of another substrate. This type of arrangement can provide a plurality of parallel-extending and closely spaced fluid flow passages 406 and 412. In the exemplary embodiment shown in FIG. 4, the closely packed arrangement of fluid flow passages 406 (e.g., heat donative fluid carriers) and fluid flow passages 412 (e.g., heat receptive fluid flow carriers) may promote efficient generation of temperature gradients across thermoelectric material layers 408, 414.

Substrate 404 may be made from any type of heat conducting material including any type of metal, such as steel, cooper, aluminum, etc. In certain embodiments, substrate 404 may include various types of ceramic materials. In one embodiment, substrate 404 may include a ductile stainless steel sheet. Substrate 404 may be configured to provide a series of curvilinear fluid flow passages, such as fluid flow passages 406 and 412, formed by undulatory pleats, as described above. Packing of these fluid flow passages, as shown in FIG. 4, can increase the heat transfer surface area density of thermoelectric module 202. This quantity represents a ratio between the total heat transfer surface area of a heat transfer device and a total volume of the heat transfer device. In certain embodiments, the heat transfer surface area density of thermoelectric module 202 may be at least 500 $Ft^2/Ft^3$. In certain other embodiments, the heat transfer surface area density may range between 800 $Ft^2/Ft^3$ and 1,000 $Ft^2/Ft^3$, or even higher.

Thermoelectric material layers 408 and 414 may be made from the high efficiency thermoelectric materials described above. Thermoelectric material layers 408 and 414 may be mounted on substrate 404 in any suitable way. In certain embodiments, thermoelectric material layers 408 and 414 may be formed by depositing one or more layers of thin films of high efficiency thermoelectric materials on substrate 404. The total thickness of thermoelectric material layers 408 and 414 may vary. For example, the thickness of thermoelectric material layers 408 and 414 may be less than 100 micrometers. In one embodiment, the thickness of thermoelectric material layers 408 and 414 may be 0.5 micrometers or less. Further, thermoelectric material layer 408 may have a different thickness from thermoelectric material layer 414. In certain embodiments, thermoelectric material layer 414 may be absent.

Figure 5:
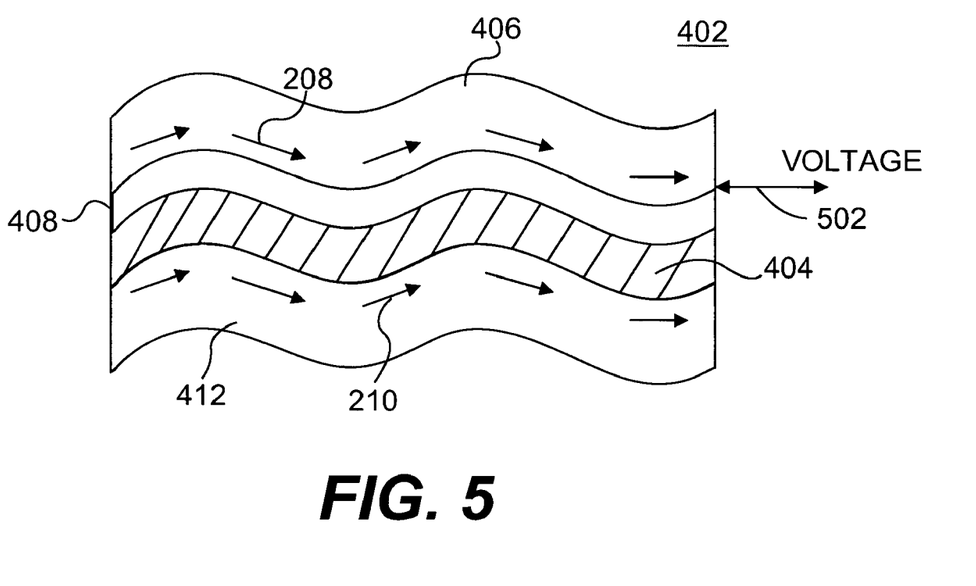
FIG. 5 illustrates a cross-sectional view taken along the line 5-5 in FIG. 4.

FIG. 5 illustrates an exemplary cross section view (i.e., taken through a sidewall portion of an undulatory pleat, as shown in FIG. 4) of details of an individual thermoelectric heat exchange element 402. As shown in FIG. 5, thermoelectric heat exchange element 402 may include substrate 404, thermoelectric material layer 408, and a voltage input/output 502. As explained above, thermoelectric heat exchange element 402 may also be coupled with fluid flow passages 406, 412. In operation of one exemplary embodiment, an exhaust stream carrying waste heat generated by engine 102 of work machine 100 may be introduced as heat donative fluid flow 208 in fluid flow passage 406. Concurrently, a cooling line may be used to provide a coolant flow that may be used as heat receptive fluid flow 210 in fluid flow passage 412. Because thermoelectric material layer 408 is deposited on substrate 404, which may form a wall between fluid flow passages 408 and 412, a temperature gradient may be generated and maintained across thermoelectric material layer 408. The maintained temperature gradient on thermoelectric material layer 408 may generate a voltage on voltage input/output 502. The voltage may then be converted into different levels by DC-DC converter 204 under the control of controller 206 to provide electrical energy for work machine 100. Thus, at least part of the thermal energy of the waste heat contained in the exhaust stream may be converted to electrical energy.

INDUSTRIAL APPLICABILITY

The disclosed thermoelectric heat exchange elements may be included in any system where there is a need for heat-to-electric energy conversion and/or efficient heating/cooling of one or more components. The disclosed thermoelectric heat exchange elements may include heat exchange structures with a high heat transfer surface area density value, or surface-to-volume ratio to provide a high heat exchange efficiency. Further, the disclosed thermoelectric heat exchange systems may include high efficiency thermoelectric materials such as low dimensional thermoelectric materials. The low dimensional thermoelectric materials may be deposited on the heat exchange structures in one or more layers of thin films. In certain embodiments, these high-efficiency, thin film thermoelectric materials can be used in heat exchange structures with high surface area to volume ratios where the use of bulk thermoelectric materials would not be possible or practical. Further, thermoelectric heat exchange systems including the high-efficiency, thin film thermoelectric materials may be more efficient and better performing than those systems including bulk thermoelectric materials.

The disclosed thermoelectric heat exchange systems may be incorporated in any vehicles or work machines to convert waste heat energy into electrical power. The waste energy may be from exhaust streams expelled by engines of the vehicles and work machines. The disclosed methods and systems may also be used in conjunction with heating and air conditioning systems to provide heated and/or cooled air to the vehicles or work machines.

Other embodiments, features, aspects, and principles of the disclosed exemplary systems will be apparent to those skilled in the art and may be implemented in various environments not limited to work site environments. Those skilled in the art will recognize that the disclosed embodiments are exemplary only, other materials and configuration may be used without departing from the scopes and principle of the disclosed embodiments.

What is claimed is:

1. A thermoelectric heat exchange module, comprising:
a first substrate including a heat receptive side and a heat donative side and a series of undulatory pleats;
a thermoelectric material layer having a ZT value of 1.0 or more disposed on at least one of the heat receptive side and the heat donative side; and
an electrical contact in electrical communication with the thermoelectric material layer,
wherein the series of undulatory pleats is structured with regularity to increase a surface area-to-volume ratio of the first substrate deposited with the thermoelectric material layer.

2. The thermoelectric heat exchange module according to claim 1, further including:
a second substrate including a heat receptive side and a heat donative side and a series of undulatory pleats;
wherein the second substrate is arranged with respect to the first substrate such that a plurality of fluid flow passages is formed between the first and second substrates by opposing undulatory pleats of the first and second substrates.

3. The thermoelectric heat exchange module according to claim 2, further including a thermoelectric material layer having a ZT value of 1.0 or more disposed on at least one of the heat receptive side and the heat donative side of the second substrate.

4. The thermoelectric heat exchange module according to claim 1, wherein the thermoelectric material layer includes a plurality of thin film layers.

5. The thermoelectric heat exchange module according to claim 1, wherein the ZT value of the thermoelectric material layer is between 1.0 and 10.

6. The thermoelectric heat exchange module according to claim 1, wherein the thermoelectric material layer includes a zero-dimensional quantum dots thermoelectric material.

7. The thermoelectric heat exchange module according to claim 1, wherein the thermoelectric material layer includes a one-dimensional nano wires thermoelectric material.

8. The thermoelectric heat exchange module according to claim 1, wherein the thermoelectric material layer includes a two-dimensional quantum well thermoelectric material.

9. The thermoelectric heat exchange module according to claim 2, wherein the plurality of fluid flow passages provides the thermoelectric heat exchange module with a heat transfer surface area density value of at least 500 $Ft^2/Ft^3$.

10. The thermoelectric heat exchange module according to claim 2, wherein the plurality of fluid flow passages provides the thermoelectric heat exchange module with a heat transfer surface area density value of between 800 $Ft^2/Ft^3$ and 1,000 $Ft^2/Ft^3$.

11. The thermoelectric heat exchange module according to claim 1, wherein the first substrate includes a metal.

12. The thermoelectric heat exchange module according to claim 1, wherein the substrate includes a ceramic.

13. A machine, comprising:
an engine that produces an exhaust stream;
an exhaust system configured to carry the exhaust stream; and
a thermoelectric heat exchange module disposed in the exhaust system, the thermoelectric heat exchange module including:
   a first substrate including a heat receptive side and a heat donative side and a series of undulatory pleats;
   a thermoelectric material layer having a ZT value of 1.0 or more disposed on at least one of the heat receptive side and the heat donative side; and
   an electrical contact in electrical communication with the thermoelectric material layer.

14. The machine of claim 13, wherein the thermoelectric heat exchange module further includes:
   a second substrate including a heat receptive side and a heat donative side and a series of undulatory pleats; and
   a thermoelectric material layer having a ZT value of 1.0 or more disposed on at least one of the heat receptive side and the heat donative side of the second substrate;
   wherein the second substrate is arranged with respect to the first substrate such that a plurality of fluid flow passages is formed between the first and second substrates by opposing undulatory pleats of the first and second substrates.

15. The machine of claim 14, wherein the plurality of fluid flow passages provides the thermoelectric heat exchange module with a heat transfer surface area density value of between 800 $Ft^2/Ft^3$ and 1,000 $Ft^2/Ft^3$.

16. The machine of claim 13, wherein the ZT value of the thermoelectric material layer is between 1.0 and 10.

17. The machine of claim 13, wherein the thermoelectric material layer includes at least one material selected from a group including a zero-dimensional quantum dots thermoelectric material, a one-dimensional nano wires thermoelectric material, and a two-dimensional quantum well thermoelectric material.

18. An method of recovering energy from a machine exhaust system, comprising:
flowing an exhaust stream from an engine through a thermoelectric heat exchange module that includes:
   a first substrate including a heat receptive side and a heat donative side and a series of undulatory pleats;
   a thermoelectric material layer having a ZT value of 1.0 or more disposed on at least one of the heat receptive side and the heat donative side; and
   an electrical contact in electrical communication with the thermoelectric material layer;
using the flowing exhaust stream to heat a first side of the thermoelectric material;
cooling a second side of the thermoelectric material to generate a temperature gradient across the thermoelectric material and a related voltage level;
providing the voltage level on the electrical contact for use by at least one electrically powered component.

19. The method according to claim 18, further including:
converting the voltage to a desired voltage level by using a DC-DC converter.

20. The method according to claim 18, wherein the thermoelectric heat exchange module further includes:
   a second substrate including a heat receptive side and a heat donative side and a series of undulatory pleats; and
   a thermoelectric material layer having a ZT value of 1.0 or more disposed on at least one of the heat receptive side and the heat donative side of the second substrate;
   wherein the second substrate is arranged with respect to the first substrate such that a plurality of fluid flow passages is formed between the first and second substrates by opposing undulatory pleats of the first and second substrates.

21. The method according to claim 20, wherein the plurality of fluid flow passages provides the thermoelectric heat exchange module with a heat transfer surface area density value of between 800 $Ft^2/Ft^3$ and 1,000 $Ft^2/Ft^3$.

22. The method of claim 18, wherein the ZT value of the thermoelectric material layer is between 1.0 and 10.

\* \* \* \* \*